(12) United States Patent
Miyamoto

(10) Patent No.: US 12,206,235 B2
(45) Date of Patent: Jan. 21, 2025

(54) DISCHARGE DETECTION SYSTEM

(71) Applicant: NITTO KOGYO CORPORATION, Nagakute (JP)

(72) Inventor: Atsushi Miyamoto, Nagakute (JP)

(73) Assignee: NITTO KOGYO CORPORATION, Nagakute (JP)

( * ) Notice: Subject to any disclaimer, the term of this patent is extended or adjusted under 35 U.S.C. 154(b) by 0 days.

(21) Appl. No.: 18/019,676

(22) PCT Filed: Aug. 3, 2021

(86) PCT No.: PCT/JP2021/028686
§ 371 (c)(1),
(2) Date: Feb. 3, 2023

(87) PCT Pub. No.: WO2022/030467
PCT Pub. Date: Feb. 10, 2022

(65) Prior Publication Data
US 2024/0258788 A1    Aug. 1, 2024

(30) Foreign Application Priority Data

Aug. 6, 2020 (JP) ................................ 2020-133523
Apr. 6, 2021 (JP) ................................ 2021-064554

(51) Int. Cl.
*H02H 3/46* (2006.01)
*G01R 29/26* (2006.01)
(Continued)

(52) U.S. Cl.
CPC .............. *H02H 3/46* (2013.01); *G01R 29/26* (2013.01); *G01R 31/14* (2013.01); *H02H 1/0092* (2013.01)

(58) Field of Classification Search
CPC ........ H02H 3/46; H02H 1/0092; G01R 29/26; G01R 31/14
See application file for complete search history.

(56) References Cited

U.S. PATENT DOCUMENTS

2005/0012507 A1* 1/2005 Kaneda ................ G01R 31/343
324/536
2008/0048668 A1* 2/2008 Mashikian ........... G01R 31/083
324/541
(Continued)

FOREIGN PATENT DOCUMENTS

JP    H8271573 A    10/1996
JP    H1194897 A    4/1999
(Continued)

*Primary Examiner* — Scott Bauer
(74) *Attorney, Agent, or Firm* — The Webb Law Firm

(57) ABSTRACT

A discharge detection system of the present invention includes a plurality of filter circuits electrically connected to each of a plurality of electrical circuits and configured to pass a noise; a plurality of amplifiers electrically connected to each of the plurality of filter circuits and configured to amplify a level of the noise passed through the filter circuit; and a processor electrically connected to each of the plurality of amplifiers and configured to detect occurrence of discharge based on the noise level amplified by the amplifier. The processor is set to have an amplification factor of the amplifier and a threshold related to the noise level. If a noise at a level of the threshold or more is output from each of two or more of the amplifiers, the processor executes a process of reducing the amplification factor of each of the two or more amplifiers, and a process of specifying any one of the noises by comparing the level of the noise output from each of the two or more amplifiers having the reduced amplification factor.

20 Claims, 8 Drawing Sheets

(51) Int. Cl.
*G01R 31/14* (2006.01)
*H02H 1/00* (2006.01)

(56) References Cited

U.S. PATENT DOCUMENTS

| | | |
|---|---|---|
| 2017/0343596 A1 | 11/2017 | Misumi |
| 2018/0252760 A1* | 9/2018 | Andle ................. H02H 1/0015 |
| 2021/0035750 A1 | 2/2021 | Miyamoto et al. |
| 2021/0190839 A1* | 6/2021 | Lim .................... G01R 23/165 |

FOREIGN PATENT DOCUMENTS

| | | |
|---|---|---|
| JP | 2005338016 A | 12/2005 |
| JP | 201521929 A | 2/2015 |
| JP | 2016166773 A | 9/2016 |
| JP | 202025460 A | 2/2020 |
| KR | 1020160046014 A | 4/2016 |

* cited by examiner

DISCHARGE DETECTION SYSTEM

CROSS REFERENCE TO RELATED APPLICATIONS

This application is the United States national phase of International Patent Application No. PCT/JP2021/028686 filed Aug. 3, 2021, and claims priority to Japanese Patent Application No. 2020-133523 filed Aug. 6, 2020, and Japanese Patent Application No. 2021-064554 filed Apr. 6, 2021, the disclosures of which are hereby incorporated by reference in their entireties.

BACKGROUND OF THE INVENTION

Field of the Invention

The present invention relates to a discharge detection system for detecting discharge occurred by an accident, such as tracking, a short circuit, and disconnection.

Description of Related Art

Japanese Patent Application Kokai Publication No. 2020-25460 (Patent Document 1) discloses a discharge detection structure built in a distribution board. The distribution board includes a main breaker, a plurality of branch breakers, and a bus to electrically connect them. Each circuit of the branch breakers has a built-in discharge detection structure. Each branch breaker has a secondary side electrically connected to, for example, a branch circuit, such as indoor wiring. To each branch circuit, a load is electrically connected. The load means, for example, a device operating by consuming electric power, such as a lighting fixture, a display, an air conditioner, and a refrigerator. When an accident, such as tracking, a short circuit, disconnection, and current leakage, occurs in the branch circuit or the load, discharge takes place between electric wires or between electrodes. When discharge occurs, a noise is superimposed on the voltage or current in the branch circuit. The discharge detection structure detects noises in a high frequency band superimposed on the voltage or current by a high pass filter and determines that discharge has occurred if the noise level is a threshold or more.

PRIOR ART DOCUMENTS

Patent Document

Patent Document 1: Japanese Patent Application Kokai Publication No. 2020-25460

SUMMARY OF THE INVENTION

Problems to be Solved by the Invention

A noise associated with discharge (hereinafter, referred to as a "discharge noise") has an excessive level. Accordingly, as illustrated in FIG. 8, if discharge occurs in a load connected to any one of a plurality of branch circuits, a discharge noise associated with the discharge turns out to propagate to other branch breakers, leading to a problem that the discharge detection structures of these branch breakers turn out to detect occurrence of discharge. This problem is caused by an excessive discharge noise passing through the one branch breaker and input to other branch breakers via the bus. The discharge detection structure of Japanese Patent Application Kokai Publication No. 2020-25460 thus includes a low pass filter to interrupt a noise (hereinafter, referred to as a "propagation noise") propagating from one branch breaker to another branch breaker. However, the discharge detection structure is built in each one of the plurality of branch breakers. Addition of a low pass filter to each of the discharge detection structures causes a problem of enormous labor and costs.

The present invention has been made in view of the above problems, and it is an object thereof to provide a discharge detection system capable of distinguishing a discharge noise from a propagation noise without adding a low pass filter to interrupt such a propagation noise.

Means to Solve the Problems (1) To achieve the above object, a first discharge detection system of the present invention for detecting discharge occurred in at least one of a plurality of electrical circuits branched into two or more based on a noise superimposed on a voltage or current, the discharge detection system includes: a plurality of filter circuits electrically connected to each of the plurality of electrical circuits and configured to pass a noise in a predetermined frequency range; a plurality of amplifiers electrically connected to each of the plurality of filter circuits and configured to amplify a level of the noise passed through the filter circuit; and at least one processor electrically connected to each of the plurality of amplifiers and configured to detect occurrence of discharge based on the noise level amplified by the amplifier, wherein the processor is set to have an amplification factor of the amplifier and a threshold related to the noise level, and if a noise at a level of the threshold or more is output from each of two or more of the amplifiers, the processor executes process of reducing the amplification factor of each of the two or more amplifiers, and process of specifying any one of the noises by comparing the level of the noise output from each of the two or more amplifiers having the reduced amplification factor.

(2) It is preferred that, in the discharge detection system of (1) above, in the process of reducing the amplification factor of each of the two or more amplifiers, the processor reduces each amplification factor to have the same value.

(3) It is preferred that, in the discharge detection system of (1) or (2) above, the processor specifies the one noise with a least reduced level by comparing the level of the noise output from each of the two or more amplifiers having the reduced amplification factor.

(4) It is preferred that, in the discharge detection system of (1) above, in the process of reducing the amplification factor of each of the two or more amplifiers, the processor reduces each amplification factor stepwise at each predetermined time to have the same value.

(5) It is preferred that, in the discharge detection system according to any one of (1) through (4) above, the processor is set to have the amplification factor, the threshold, and a determination time to determine whether discharge has occurred, the processor is capable of selectively executing either one of a discharge detection mode or a learning mode, the processor in the discharge detection mode executes process of determining whether discharge has occurred by comparing a duration time of the noise at the level of the threshold or more with the determination time, and the processor in the learning mode executes process of sampling the noise at the level of the threshold or more and resetting at least one value of the settings based on a result of the sampling.

(6) It is preferred that, in the discharge detection system according to any one of (1) through (5) above, each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

(7) To achieve the above object, a second discharge detection system of the present invention for detecting discharge occurred in at least one of a plurality of electrical circuits branched into two or more based on a noise superimposed on a voltage or current, the discharge detection system includes: a plurality of filter circuits electrically connected to each of the plurality of electrical circuits and configured to pass a noise in a predetermined frequency range; a plurality of amplifiers electrically connected to each of the plurality of filter circuits and configured to amplify a level of the noise passed through the filter circuit; and at least one processor electrically connected to each of the plurality of amplifiers and configured to detect occurrence of discharge based on the noise level amplified by the amplifier, wherein the processor is set to have an amplification factor of the amplifier, a threshold related to the noise level, and a determination time to determine whether discharge has occurred and the processor executes process of reducing and increasing the amplification factor of each amplifier with a fixed period, process of comparing a level of the noise output from each amplifier having the reduced or increased amplification factor with the threshold, process of measuring a duration time of the noise if the noise level is the threshold or more, and process of determining that discharge has occurred if the duration time of the noise is the determination time or more.

Effects of the Invention

The discharge detection system of the present invention allows a discharge noise to be distinguished from a propagation noise without adding a low pass filter to interrupt such a propagation noise.

DESCRIPTION OF THE INVENTION

A discharge detector according to an embodiment of the present invention is described below with reference to the drawings.

1. Discharge Detection System

Figure 1:
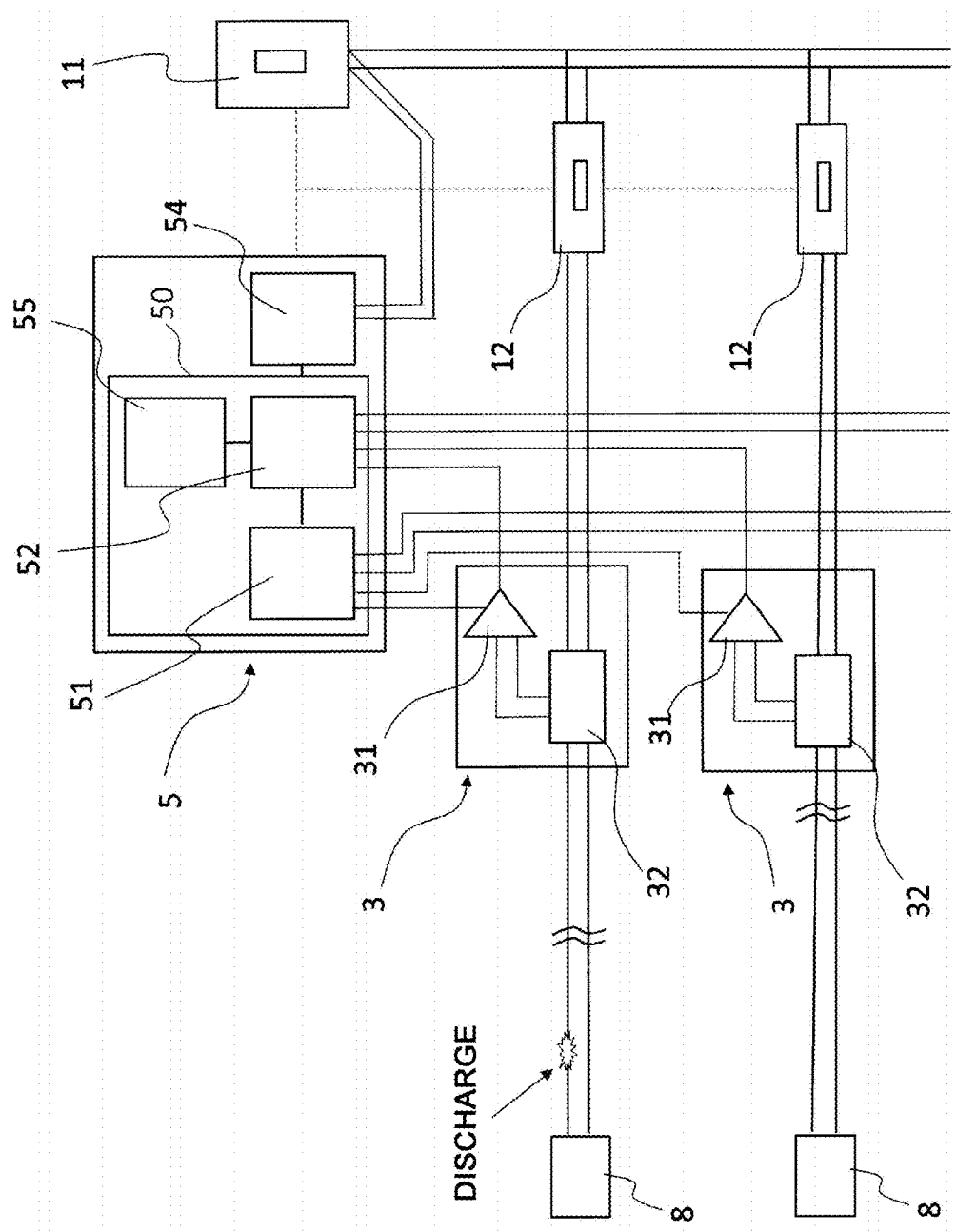
FIG. 1 is a schematic diagram illustrating a discharge detection system according to an embodiment of the present invention.

FIG. 1 illustrates a discharge detection system in the present embodiment electrically connected to an electrical circuit. The discharge detection system is electrically connected to, for example, an electrical circuit constituting a distribution board. The distribution board includes a main breaker 11, a plurality of branch breakers 12, and a bus to electrically connect them. The main breaker 11 has a primary side electrically connected to an incoming line of power, not shown. The main breaker 11 has a secondary side electrically connected to the bus. To the bus, the plurality of branch breakers 12 are electrically connected. Each of the plurality of branch breakers 12 has a secondary side is electrically connected to a branch circuit, such as indoor wiring. To each branch circuit, a load 8 is electrically connected. The load 8 operates by consuming alternating current power, which is the utility power.

An accident, such as tracking, a short circuit, and disconnection, may occur in the branch circuits and the loads. The discharge detection system in the present embodiment detects discharge occurred due to an accident, such as tracking, a short circuit, and disconnection. When discharge occurs, a discharge noise at an excessive level is superimposed on the voltage or current in the branch circuit. The discharge detection system determines whether discharge has occurred based on a duration time of the noise at the level of a threshold or more. The discharge detection system also specifies the discharge noise by eliminating propagation noises from the subject of the determination if a plurality of noises at levels of the threshold or more are detected.

Figure 2:
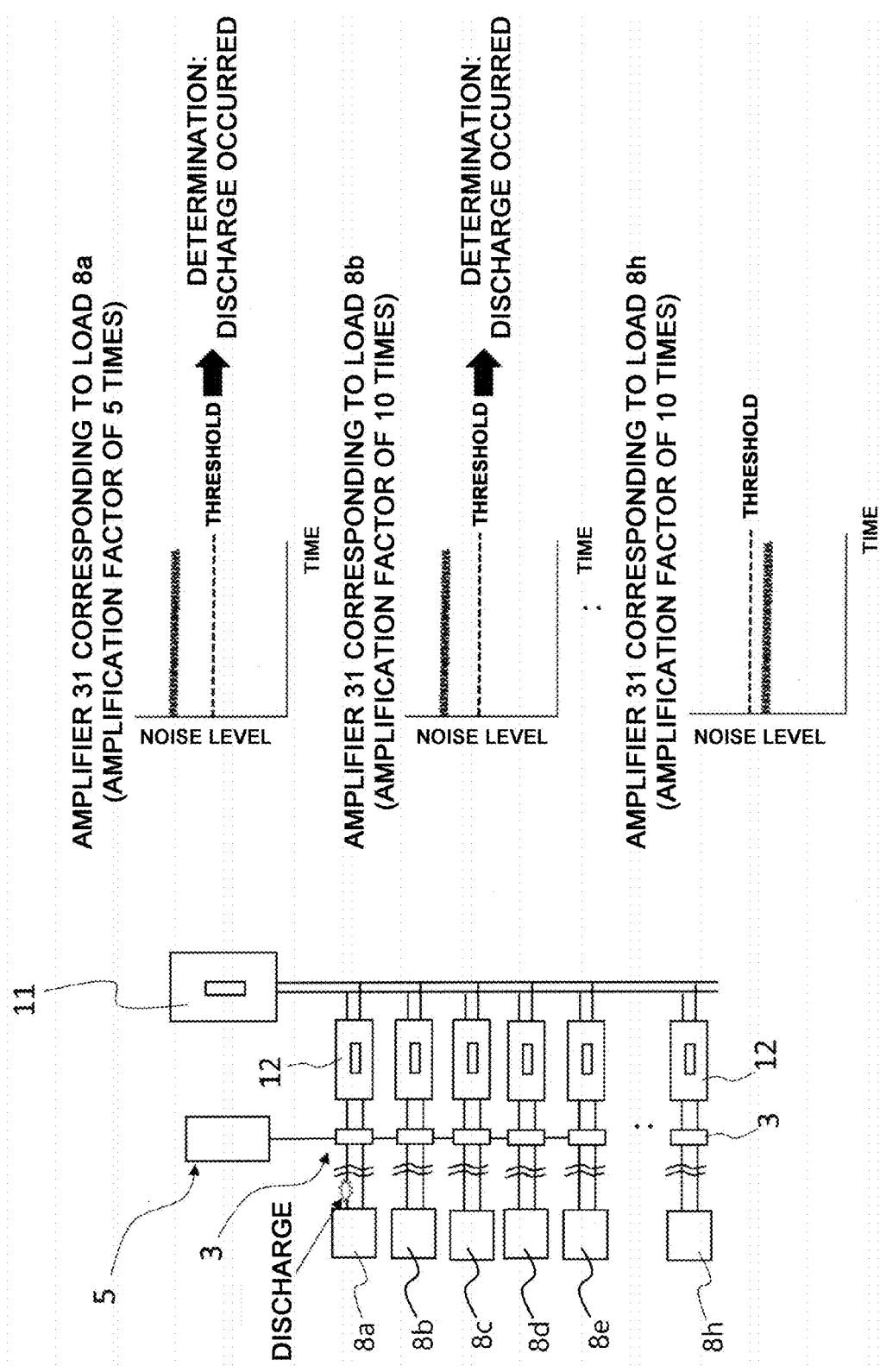
FIG. 2 is a schematic diagram illustrating the discharge detection system and three waveform diagrams illustrating relationship between the noise level detected by the discharge detection system and time.

As illustrated in FIGS. 1 and 2, the discharge detection system in the present embodiment is configured with one main unit 5 and a plurality of subunits 3. The main unit 5 includes a processor 50 and a power circuit 54. The processor 50 includes a reset mechanism 51, a determination mechanism 52, and an arithmetic mechanism 55. Each of the plurality of subunits 3 includes an amplifier 31 and a filter circuit 32.

The filter circuit 32 of each subunit 3 is configured by, for example, connecting a capacitor and a resistor, not shown, in parallel to the branch circuit. The filter circuit 32 removes the utility frequency and passes noises in a predetermined frequency range. In the present embodiment, the noise means a voltage and is output from both ends of the resistor constituting the filter circuit 32. The amplifier 31 amplifies the level of the noise passed through the filter circuit 32 and outputs the noise to the processor 50.

The processor 50 detects occurrence of discharge based on the noise level amplified by the amplifier 31. The determination mechanism 52 determines whether discharge has occurred based on the duration time of the noise at the level of the threshold or more. In addition, if a plurality of noises at levels of the threshold or more are detected, the determination mechanism 52 specifies the discharge noise by eliminating propagation noises from these noises. The arithmetic mechanism 55 calculates values for the determination by the determination mechanism 52. If a plurality of noises at levels of the threshold or more are detected, the reset mechanism 51 changes the value of the setting of the amplification factor (multiple) of the amplifier 31. All of the reset mechanism 51, the determination mechanism 52, and the arithmetic mechanism 55 are programs to cause the processor 50 to execute predetermined process.

The processor 50 is electrically connected to the main breaker 11 and each branch breaker 12. The processor 50 is capable of interrupting the main breaker 11 and/or the branch breakers 12 by outputting a signal if detecting discharge. The power circuit 54 is electrically connected to the secondary side of the main breaker 11 to supply the electric power to the main unit 5. The power supplied to the main unit 5 is further supplied to each subunit 3.

2. Process for Specifying Discharge Noise

A description is then given to process for specifying a discharge noise executed by the processor 50 of the main unit 5. As described above, the determination mechanism 52 of the processor 50 determines whether discharge has occurred based on the duration time of the noise at the level of the threshold or more. However, as illustrated in FIG. 2, if discharge occurs in a load 8a connected to any one of the plurality of branch circuits, a discharge noise associated with the discharge sometimes propagates to a plurality of branch breakers 12, causing the amplifiers 31 of the plurality of subunits 3 to output noises at levels of the threshold or more. In such a case, the processor 50 executes process of specifying the discharge noise by eliminating propagation noises from the plurality of noises at the levels of the threshold or more.

2.1 Specification of Discharge Noise Based on Reduced Amount of Noise Level

When the amplification factor of each amplifier 31 having output the noise at the level of the threshold or more is reduced, the processor 50 is capable of specifying the noise with the least reduced level as the discharge noise.

In the three waveform diagrams of FIG. 2, the discharge noise occurred in the load 8a has an excessive level. The amplifier 31 corresponding to the load 8a thus outputs a noise at a level more than the threshold even when the amplification factor is reduced from 10 times to 5 times. Meanwhile, the amplifier 31 corresponding to each of the loads 8b through 8h outputs a propagation noise due to the discharge noise. The level of the propagation noise is attenuated more with increasing distance from the source of the discharge noise. For example, the amplifier 31 corresponding to the load 8b closest to the source of the discharge noise outputs a noise at a level more than the threshold when the amplification factor is set at 10 times. The amplifier 31 corresponding to the load 8h most distant from the source of the discharge noise outputs a noise at a level less than the threshold when the amplification factor is set at 10 times.

Figure 3:
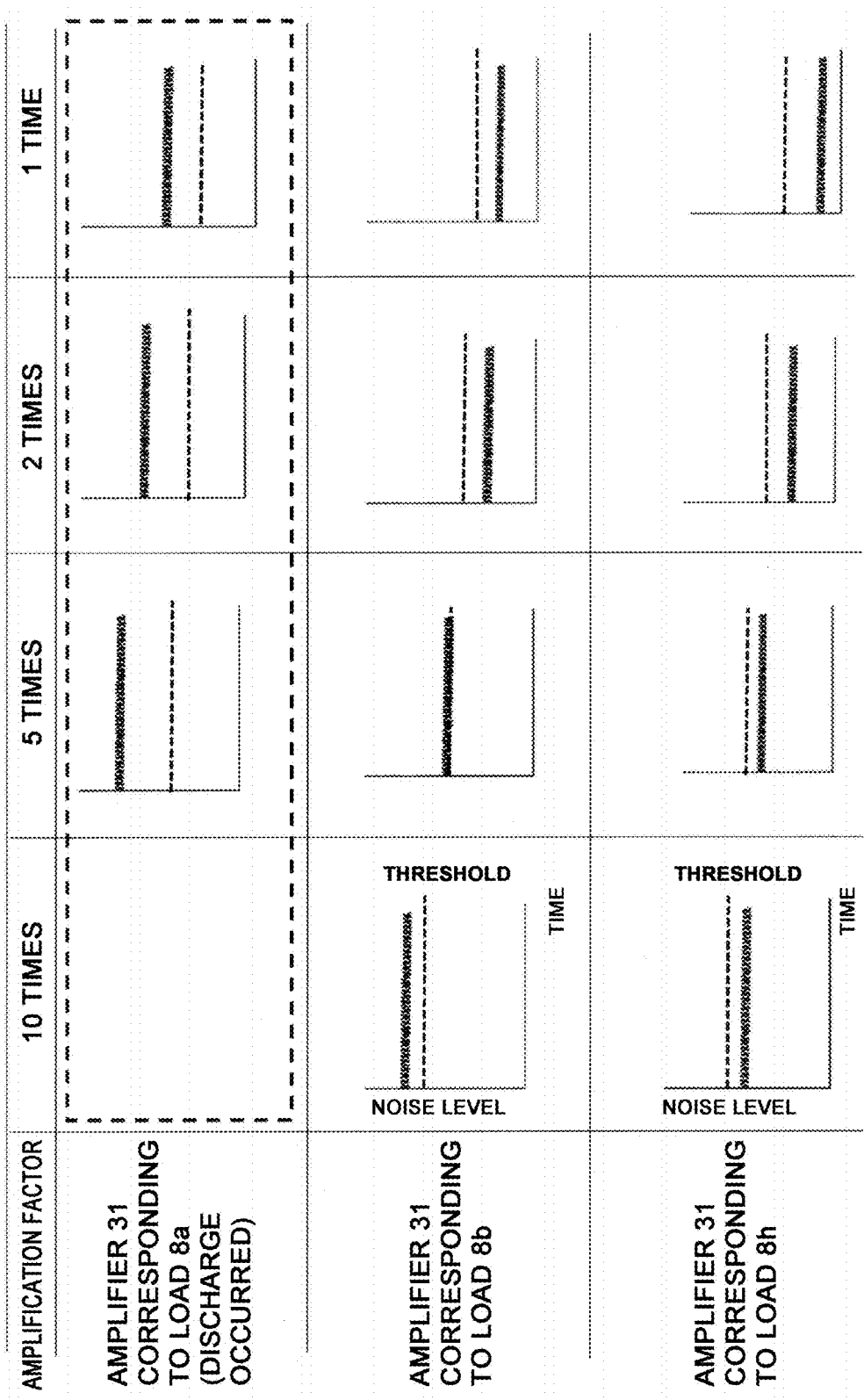
FIG. 3 shows 11 waveform diagrams illustrating relationship between the noise level and time when the amplification factor of amplifiers constituting the discharge detection system is reduced to the same values.

As illustrated in FIG. 3, the discharge noise output from the amplifier 31 corresponding to the load 8a has a less reduced level when the amplification factor is reduced from 5 times to 2 times and 1 time, and has a level more than the threshold even when the amplification factor is set at 1 time. In contrast, the propagation noise output from the amplifier 31 corresponding to the load 8b has a more reduced level when the amplification factor is reduced from 10 times to 5 times, 2 times, and 1 time, and has a level less than the threshold when the amplification factor is 2 times and 1 time. It should be noted that the processor 50 is set to have four thresholds corresponding to each of the amplification factors of 10 times, 5 times, 2 times, and 1 time and a smaller threshold is used with reduction in the amplification factor.

As described above, the processor 50 is capable of specifying which noise is the discharge noise by reducing the amplification factor of the amplifier 31 corresponding to each of the loads 8a through 8h to compare the reduced amount of the level of the noise output from each amplifier 31. For example, the processor 50 may specify which noise is the discharge noise by reducing the amplification factor of the two amplifiers 31 corresponding to the loads 8a and 8b outputting the noises at the levels of the threshold or more. As indicated by a broken line in FIG. 3, the level of the noise output from the amplifier 31 corresponding to the load 8a is less reduced than the level of the noise output from the amplifier 31 corresponding to the load 8b. As a result, the processor 50 determines that the noise output from the amplifier 31 corresponding to the load 8a is the discharge noise.

The processor 50 then determines that discharge has occurred when the duration time of the discharge noise reaches a preset determination time (e.g., 500 ms) or more. Based on the result of the determination, the processor 50 detects occurrence of discharge. The processor 50 having detected the occurrence of discharge executes, for example, process for interrupting the branch breaker 12 to which the load 8a is electrically connected, process for issuing an alarm, and the like. Moreover, the processor 50 is also capable of reporting that discharge has occurred in the branch circuit to which the subunit 3 corresponding to the load 8a is electrically connected, that is, the source of discharge.

2.2 Specification of Discharge Noise Based on Magnitude of Noise Level

The processor 50 is capable of specifying the noise at the highest level as the discharge noise when the amplification factor of each of the plurality of amplifiers 31 outputting the noises at the levels of the threshold or more is reduced to the same value.

Figure 4:
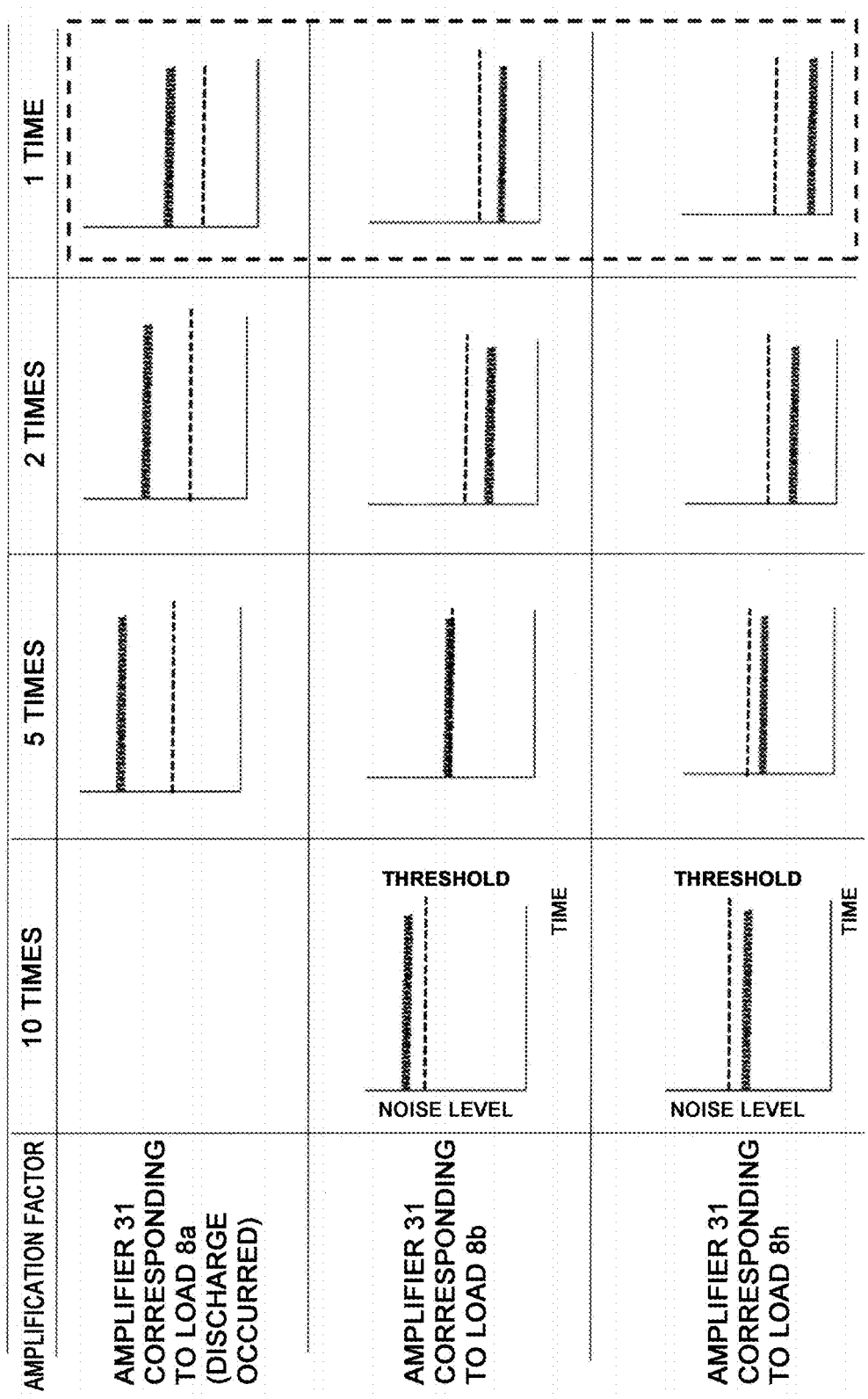
FIG. 4 shows 11 waveform diagrams illustrating relationship between the noise level and time when the amplification factor of the amplifiers is reduced to the same values.

For example, as indicated by a broken line in FIG. 4, the processor 50 uniformly reduces the amplification factor of the amplifier 31 corresponding to each of the loads 8a through 8h to 1 time and measures the level of the noise output from each amplifier 31. As a result, the processor 50 determines that the noise output from the amplifier 31 corresponding to the load 8a at the highest level as the discharge noise.

The processor 50 then determines that discharge has occurred when the duration time of the discharge noise reaches a preset determination time (e.g., 500 ms) or more. Based on the result of the determination, the processor 50 detects occurrence of discharge. The processor 50 having detected the occurrence of discharge executes, for example, process for interrupting the branch breaker 12 to which the load 8a is electrically connected, process for issuing an alarm, and the like. Moreover, the processor 50 is also capable of reporting that discharge has occurred in the branch circuit to which the subunit 3 corresponding to the load 8a is electrically connected, that is, the source of discharge.

2.3 Process of Reducing Amplification Factor at Each Predetermined Time

In the process of reducing the amplification factor of each of the plurality of amplifiers 31, the processor 50 may reduce the amplification factor of each amplifier 31 stepwise at each predetermined time to have the same value.

Figure 5:
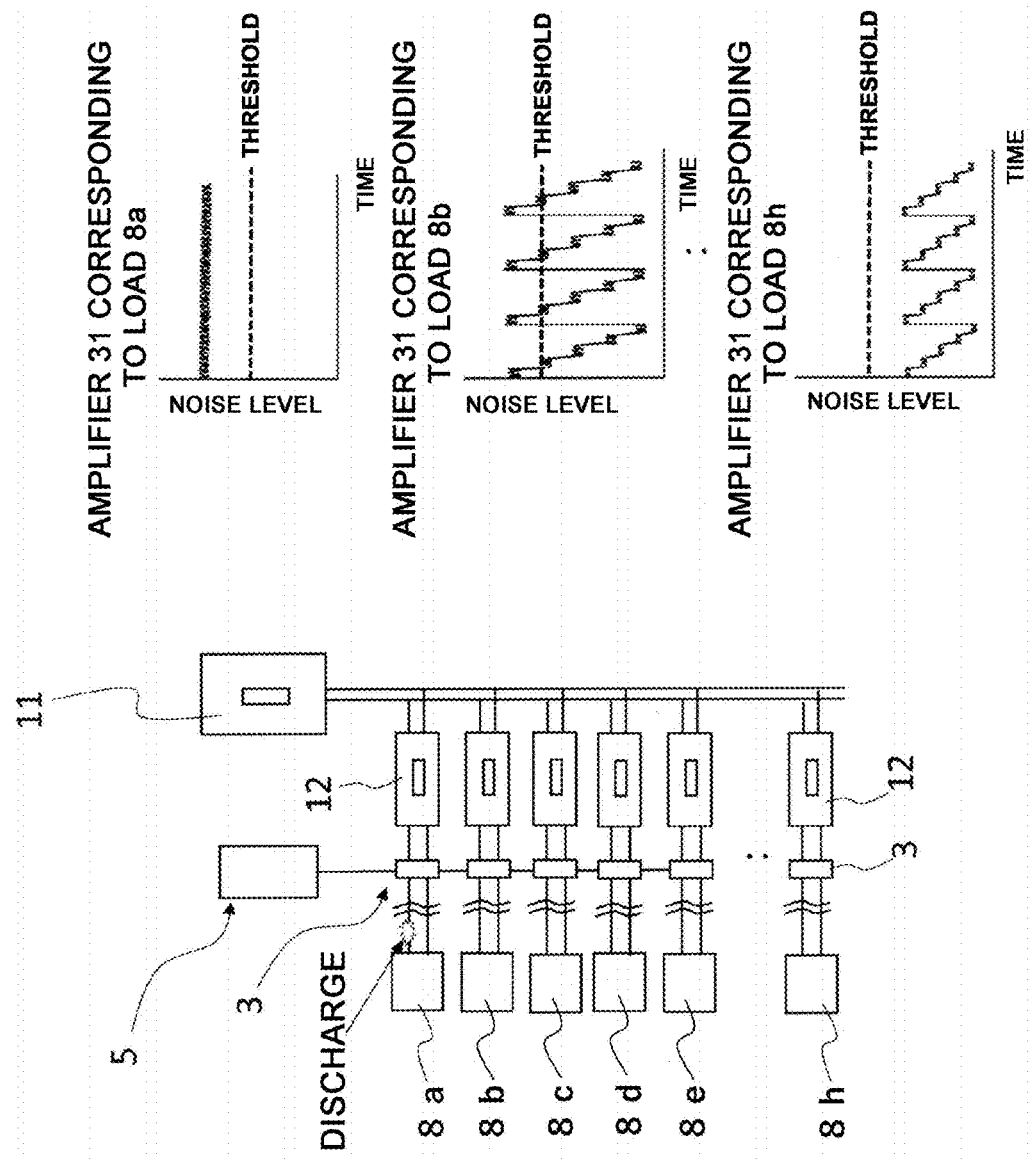
FIG. 5 is a schematic diagram illustrating the discharge detection system and three waveform diagrams illustrating relationship between the noise level detected by the discharge detection system and time when the power of the amplifiers is reduced to the same values at each predetermined time.

For example, as illustrated in the three waveform diagrams of FIG. 5, the processor 50 reduces the amplification factor of the amplifier 31 corresponding to each of the loads 8a through 8h stepwise from 20 times to 10 times, 5 times, and 2 times at each 1 ms and measures the noise level amplified with each amplification factor. When the measurement of the noise level with an amplification factor of 2 times is completed, the amplification factor of the amplifier 31 corresponding to each of the loads 8a through 8h is increased again from 2 times to 20 times and reduced stepwise from 20 times to 10 times, 5 times, and 2 times at each 1 ms. The processor 50 determines that the noise at the levels more than the threshold with any of the amplification factors of 20 times, 10 times, 5 times, and 2 times is the discharge noise. As another example, the processor 50 is also capable of determining which noise is the discharge noise by comparing the noise level amplified with an amplification factor of any of 20 times, 10 times, 5 times, and 2 times. It is possible to detect occurrence of instantaneous discharge by reducing the amplification factor of the amplifier 31 at each short period of time, such as 1 ms.

The processor 50 may calculate a total value or average value of the noise level amplified with each amplification factor of 20 times, 10 times, 5 times, and 2 times and compare the level of the noise output from the amplifier 31 corresponding to each of the loads 8a through 8h. In this case, the processor 50 determines that the noise having the largest total value or average value is the discharge noise. The calculation and comparison of the total value or average value of the noise level allow reduction in the number of determinations for specifying the discharge noise, causing reduction in the time until specifying the discharge noise. As a result, it becomes possible to detect discharge ending in a relatively short period of time.

Figure 6:
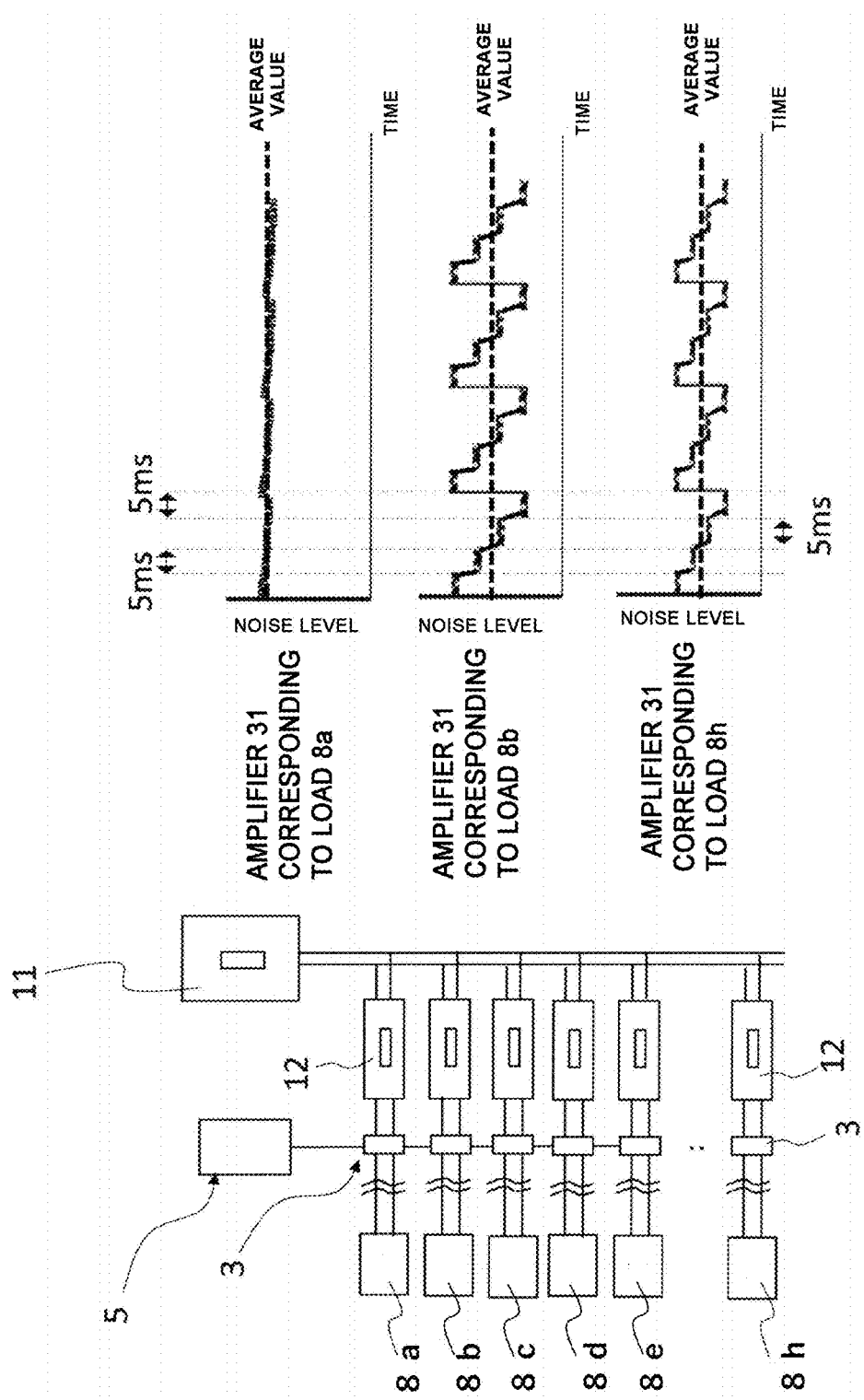
FIG. 6 is a schematic diagram illustrating the discharge detection system and three waveform diagrams illustrating relationship between the noise level and time when the power of the amplifiers is reduced to the same values at each predetermined time.

For example, as illustrated in the three waveform diagrams of FIG. 6, the processor 50 may reduce the amplification factor of the amplifier 31 corresponding to each of the loads 8a through 8h stepwise from 20 times to 10 times, 5 times, and 2 times at each 5 ms and measure the noise level amplified with each amplification factor. In this case, the amplification factor is increased from 2 times to 20 times with a period of 20 ms and measurement of the noise level amplified with the amplification factors of 20 times, 10 times, 5 times, and 2 times is repeated. The processor 50 may calculate a total value or average value of the noise level amplified with each amplification factor of 20 times, 10 times, 5 times, and 2 times and compare the level of the noise output from the amplifier 31 corresponding to each of the loads 8a through 8h. In this case, the processor 50 determines that the noise having the largest total value or average value is the discharge noise.

In the embodiment illustrated in FIG. 6, the amplification factor of the amplifiers 31 is reduced in four steps of 20 times, 10 times, 5 times, and 2 times while the amplification factor of the amplifiers 31 may be reduced in three steps, two steps, or five steps or more.

The above process of reducing the amplification factor of the amplifiers 31 stepwise at each predetermined time and measuring the noise level may be executed only on the two or more amplifiers 31 outputting the noises at the levels of the threshold or more. As another example, the process may be executed on all the amplifiers 31 in the timing before the processor 50 detects the noises at the levels of the threshold or more. Moreover, the maximum value of the amplification factor of the amplifiers 31 may be a value reset in a learning mode described later.

3. Change in Value of Settings in Learning Mode

The discharge detection system is intended to detect discharge occurred by an accident, such as tracking, a short circuit, and disconnection. However, some of the loads 8a through 8h continuously generate the noises at the levels of the threshold or more set in the processor 50. For example, fluorescent lamps sometimes continuously generate noises at levels more than the threshold for a while after being turned on. Thus, discharge detection systems turn out to make an erroneous determination that discharge has occurred due to a noise generated by normal operation of a load.

Figure 7:
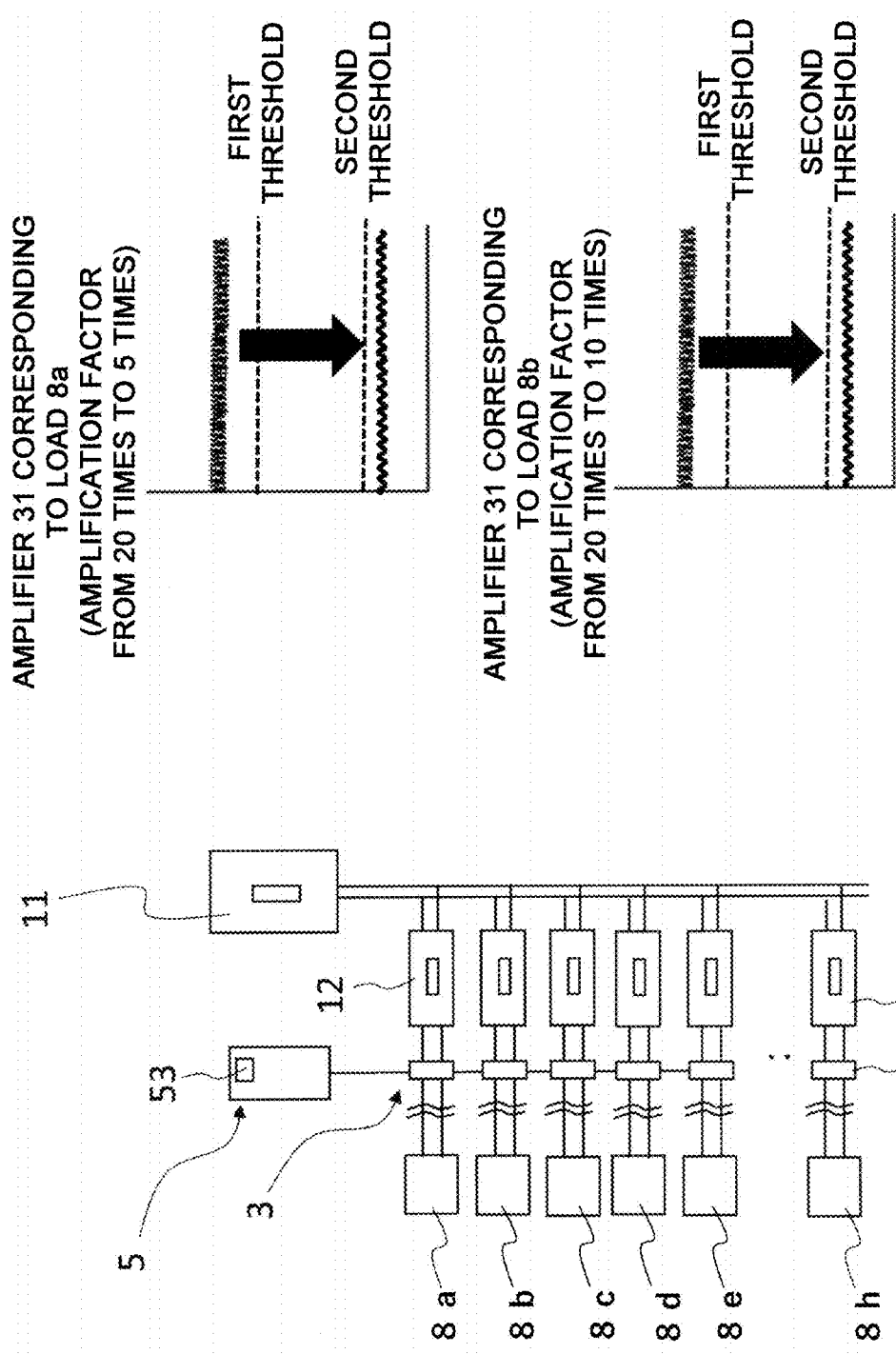
FIG. 7 is a schematic diagram illustrating the discharge detection system and two waveform diagrams illustrating relationship between the noise level and time when the amplification factor of the amplifiers is reduced to different values.
Figure 8:
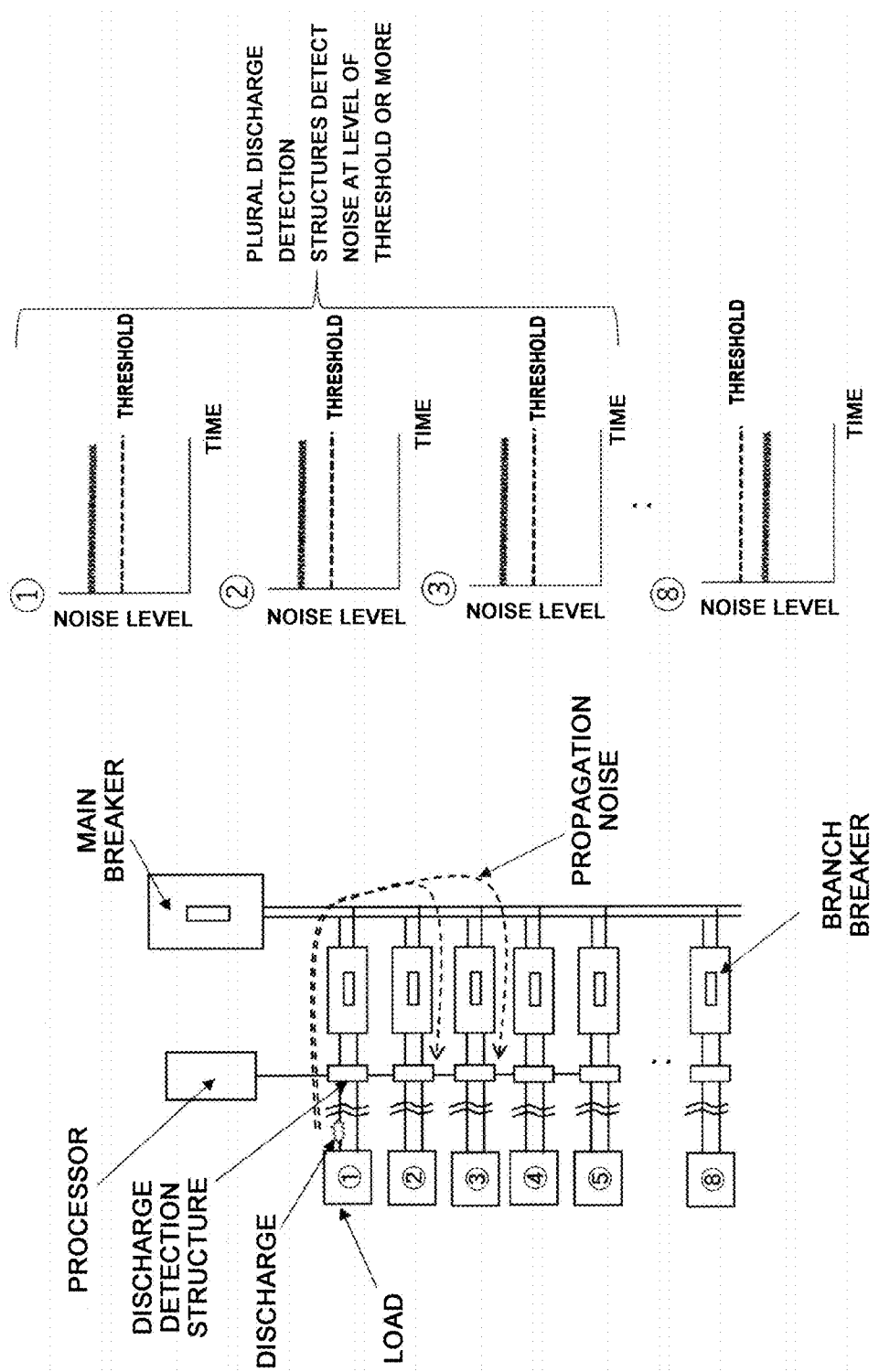
FIG. 8 is a schematic diagram illustrating a discharge detection structure in the past and four waveform diagrams illustrating relationship between the noise level detected by the discharge detection structure and time.

For this reason, as the discharge detection system illustrated in FIG. 7, the processor 50 includes a learning mechanism 53 for executing the learning mode. The learning mechanism 53 is a program to cause the processor 50 to execute process in the learning mode. The processor 50 is set to have the amplification factor, the threshold, and the determination time to determine whether discharge has occurred. The processor 50 in the learning mode executes process of sampling noises at the levels of the threshold or more and resetting one or more values of the settings used for determinations whether discharge has occurred based on the result of the sampling. The resetting of the one or more values of the settings in the learning mode causes a change in criteria for determination of occurrence of discharge. As a result, the discharge detection sensitivity of the processor 50 is corrected to a higher or lower level.

3.1 Resetting of Amplification Factor

If a noise is detected at the level of the threshold or more due to normal operation of the loads 8a through 8h, the learning mode is executed to reset the value of the amplification factor of the amplifiers 31 corresponding to the loads 8a through 8h. The two waveform diagrams in FIG. 7 illustrate the levels of the noises generated by normal operation of the loads 8a and 8b. Both noises have levels more than a first threshold preset in the processor 50. The first threshold is a determination criterion for the processor 50 to determine occurrence of discharge. The processor 50 determines that discharge has occurred when the duration time of the noise at the level of the first threshold or more reaches the determination time or more. Thus, the noises of the loads 8a and 8b illustrated in FIG. 7 have a risk of causing the processor 50 to make erroneous determinations.

The processor 50 executes the learning mode based on a signal output from an operation section, such as a switch, a button, and a touch screen, not shown. The processor 50 in the learning mode samples a noise at the first threshold or more output from each of the amplifiers 31 corresponding to the loads 8a through 8h. The processor 50 executes the process of reducing the amplification factor of any of the amplifiers 31 if the level of the noise output from the amplifiers 31 is the first threshold or more. For example, as illustrated in FIG. 7, the amplification factor of the amplifier 31 corresponding to the load 8a is reduced from 20 times to 5 times. As another example, the amplification factor of the amplifier 31 corresponding to the load 8b is reduced from 20 times to 10 times.

The processor 50 then compares the level of the noise output from the amplifier 31 and having the reduced amplification factor with a second threshold. The second threshold is a value smaller than the first threshold and is set in the reset mechanism 51. The second threshold is preferably set to a value that cannot exceed the noise level of any of the loads 8a through 8h. If the noise level is the second threshold or more, the processor 50 reduces the amplification factor of the amplifier 31 again and compares the noise level with the second threshold. Meanwhile, if the noise level is less than the second threshold, the processor 50 terminates the process of reducing the amplification factor of the amplifier 31. Due to the above-described process of resetting the amplification factor, the noise levels of the loads 8a and 8b illustrated in FIG. 7 are reduced to substantially less than the first threshold used for determinations of occurrence of discharge. Accordingly, the noises of the loads 8a and 8b do not cause an erroneous determination of occurrence of discharge. This allows the processor 50 to accurately detect only occurrence of discharge while ignoring the noises of the loads 8a and 8b.

3.2 Learning Period

In the learning mode, the learning period is set for sampling the noises at the levels of the threshold or more by the processor 50. The length of the learning period may be set in, for example, hours, days, weeks, or months. The learning period may also be set by combining two or more of hours, days, weeks, and months. For example, for the discharge detection system to be installed in indoor wiring of a fully automated factory, the learning period is preferably set in a day or a week. In particular, a learning period of a week allows calculation of the optimal value of the setting of the determination time by executing the sampling by the processor 50 on weekdays and holidays and sampling noises from various devices operating in the factory without omission.

For example, the learning period may be a combination of a day and hours. In this case, the processor 50 executes the process of sampling noises at levels more than the threshold for given hours (e.g., from 9:00 to 17:00) in a day. As another example, the learning period may be a combination of a week and hours. In this case, the processor 50 executes the sampling of noises at levels more than the threshold for given hours every day in the week. As still another example, the learning period may be a combination of a month, weeks, days, and hours. In this case, the processor 50 executes the sampling of noises at levels more than the threshold for given hours on given days every week in the month.

It should be noted that the learning mode is initiated by manually operating the operation section, not shown. For example, if the learning period is set in a length of hours (e.g., 1 hour), the processor 50 immediately executes the sampling of noises at levels more than the threshold based on the signal from the operation section. As another example, if a start time and an end time are set for the learning period, the processor 50 executes the sampling of noises at levels more than the threshold at a preset start time (e.g., 9:00) based on the signal from the operation section.

3.3 Operation Section

The operation section for causing the processor 50 to execute the learning mode has a configuration that is not particularly limited and may be, for example, a simple switch or button. The operation section may also be configured with a plurality of switches or buttons. In this case, a function of initializing the reset value of the amplification factor of the amplifiers 31 to the initial values of the settings before shipment from the factory may be assigned to any of the plurality of switches or buttons. Moreover, the operation section may be configured with a touch screen to display images of such a plurality of switches or buttons.

3.4 Upper Limit of Duration Time

In the learning mode, the processor 50 does not determine occurrence of discharge by comparing the duration time of the noise with the determination time. In the learning mode, an upper limit is thus set on the duration time of the noise measured by the processor 50. The processor 50 determines that discharge has occurred if the value of the duration time of the noise at the level of the threshold or more exceeds the preset upper limit. Based on the result of the determination, the processor 50 detects occurrence of discharge. The processor 50 having detected the occurrence of discharge executes, for example, process for interrupting the branch breaker 12 to which the load 8a or 8b is electrically connected, process for issuing an alarm, and the like.

4. Others

The discharge detection system of the present invention is not limited to the embodiment described above. For example, in the embodiment described above, the processor 50 determines whether discharge has occurred based on the noise superimposed on the voltage. However, the processor 50 is also capable of determining whether discharge has occurred based on a noise superimposed on the current. For example, it is possible to detect a noise of the threshold or more superimposed on the current by converting power of an alternating current, which is the utility power, to a direct current by a CT (current transformer).

For example, the plurality of amplifiers 31 may be configured to be built in the main unit 5, not in the subunits 3. As another example, the subunits 3 are not limited to the configuration in the present embodiment where they are connected to the secondary side of the branch breakers 12 in series. For example, the subunits 3 may be connected to the primary side of the branch breakers 12 in series or may be connected to either one of the primary side or the secondary side of the branch breakers 12 in parallel.

DESCRIPTION OF REFERENCE NUMERALS

3 Subunit
5 Main Unit
8, 8a-8h Load
12 Branch Breaker
31 Amplifier
50 Processor
51 Reset Mechanism
52 Determination Mechanism
53 Learning Mechanism
54 Power Circuit
55 Arithmetic Mechanism

The invention claimed is:

1. A discharge detection system for detecting discharge occurred in at least one of a plurality of electrical circuits branched into two or more based on a noise superimposed on a voltage or current, the discharge detection system comprising:
  a plurality of filter circuits electrically connected to each of the plurality of electrical circuits and configured to pass a noise in a predetermined frequency range;

a plurality of amplifiers electrically connected to each of the plurality of filter circuits and configured to amplify a level of the noise passed through the filter circuit; and at least one processor electrically connected to each of the plurality of amplifiers and configured to detect occurrence of discharge based on the noise level amplified by the amplifier, wherein the processor is set to have an amplification factor of the amplifier and a threshold related to the noise level, and if a noise at a level of the threshold or more is output from each of two or more of the amplifiers, the processor executes a process of reducing the amplification factor of each of the two or more amplifiers, and a process of specifying any one of the noises by comparing the level of the noise output from each of the two or more amplifiers having the reduced amplification factor.

2. The discharge detection system according to claim 1, wherein, in the process of reducing the amplification factor of each of the two or more amplifiers, the processor reduces each amplification factor to have the same value.

3. The discharge detection system according to claim 1, wherein the processor specifies the one noise with a least reduced level by comparing the level of the noise output from each of the two or more amplifiers having the reduced amplification factor.

4. The discharge detection system according to claim 1, wherein, in the process of reducing the amplification factor of each of the two or more amplifiers, the processor reduces each amplification factor stepwise at each predetermined time to have the same value.

5. The discharge detection system according to claim 1, wherein the processor is set to have the amplification factor, the threshold, and a determination time to determine whether discharge has occurred, the processor is capable of selectively executing either one of a discharge detection mode or a learning mode, the processor in the discharge detection mode executes process of determining whether discharge has occurred by comparing a duration time of the noise at the level of the threshold or more with the determination time, and the processor in the learning mode executes process of sampling the noise at the level of the threshold or more and resetting at least one value of the settings based on a result of the sampling.

6. The discharge detection system according to claim 1, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

7. The discharge detection system according to claim 2, wherein the processor specifies the one noise with a least reduced level by comparing the level of the noise output from each of the two or more amplifiers having the reduced amplification factor.

8. The discharge detection system according to claim 2, wherein the processor is set to have the amplification factor, the threshold, and a determination time to determine whether discharge has occurred, the processor is capable of selectively executing either one of a discharge detection mode or a learning mode, the processor in the discharge detection mode executes process of determining whether discharge has occurred by comparing a duration time of the noise at the level of the threshold or more with the determination time, and the processor in the learning mode executes process of sampling the noise at the level of the threshold or more and resetting at least one value of the settings based on a result of the sampling.

9. The discharge detection system according to claim 3, wherein the processor is set to have the amplification factor, the threshold, and a determination time to determine whether discharge has occurred, the processor is capable of selectively executing either one of a discharge detection mode or a learning mode, the processor in the discharge detection mode executes process of determining whether discharge has occurred by comparing a duration time of the noise at the level of the threshold or more with the determination time, and the processor in the learning mode executes process of sampling the noise at the level of the threshold or more and resetting at least one value of the settings based on a result of the sampling.

10. The discharge detection system according to claim 4, wherein the processor is set to have the amplification factor, the threshold, and a determination time to determine whether discharge has occurred, the processor is capable of selectively executing either one of a discharge detection mode or a learning mode, the processor in the discharge detection mode executes process of determining whether discharge has occurred by comparing a duration time of the noise at the level of the threshold or more with the determination time, and the processor in the learning mode executes process of sampling the noise at the level of the threshold or more and resetting at least one value of the settings based on a result of the sampling.

11. The discharge detection system according to claim 7, wherein the processor is set to have the amplification factor, the threshold, and a determination time to determine whether discharge has occurred, the processor is capable of selectively executing either one of a discharge detection mode or a learning mode, the processor in the discharge detection mode executes process of determining whether discharge has occurred by comparing a duration time of the noise at the level of the threshold or more with the determination time, and the processor in the learning mode executes process of sampling the noise at the level of the threshold or more and resetting at least one value of the settings based on a result of the sampling.

12. The discharge detection system according to claim 2, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

13. The discharge detection system according to claim 3, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

14. The discharge detection system according to claim 4, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

15. The discharge detection system according to claim 5, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

16. The discharge detection system according to claim 7, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

17. The discharge detection system according to claim 8, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

18. The discharge detection system according to claim 9, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

19. The discharge detection system according to claim 10, wherein each of the plurality of filter circuits is electrically connected to a corresponding one of a plurality of branch breakers constituting a distribution board, the processor is capable of outputting a signal to interrupt each of the plurality of branch breakers, and if detecting occurrence of discharge based on the level of the noise output from one of the amplifiers electrically connected to one of the filter circuits, the processor outputs the signal to one of the branch breakers in electrical connection with the one filter circuit.

20. A discharge detection system for detecting discharge occurred in at least one of a plurality of electrical circuits branched into two or more based on a noise superimposed on a voltage or current, the discharge detection system comprising:

a plurality of filter circuits electrically connected to each of the plurality of electrical circuits and configured to pass a noise in a predetermined frequency range;

a plurality of amplifiers electrically connected to each of the plurality of filter circuits and configured to amplify a level of the noise passed through the filter circuit; and at least one processor electrically connected to each of the plurality of amplifiers and configured to detect occurrence of discharge based on the noise level amplified by the amplifier, wherein the processor is set to have an amplification factor of the amplifier, a threshold related to the noise level, and a determination time to determine whether discharge has occurred and the processor executes a process of reducing and increasing the amplification factor of each amplifier with a fixed period, a process of comparing a level of the noise output from each amplifier having the reduced or increased amplification factor with the threshold, a process of measuring a duration time of the noise if the noise level is the threshold or more, and a process of determining that discharge has occurred if the duration time of the noise is the determination time or more.

* * * * *